United States Patent [19]
Nakamura et al.

[11] Patent Number: 5,383,150
[45] Date of Patent: Jan. 17, 1995

[54] SEMICONDUCTOR MEMORY DEVICE

[75] Inventors: Masayuki Nakamura, Akishima; Kazuyoshi Oshima, Ohme, both of Japan

[73] Assignee: Hitachi, Ltd., Tokyo, Japan

[21] Appl. No.: 183,958

[22] Filed: Jan. 19, 1994

[30] Foreign Application Priority Data

Jan. 25, 1993 [JP] Japan .................................. 5-028600

[51] Int. Cl.$^6$ ...................... G11C 13/00; G11C 11/22
[52] U.S. Cl. ................................... 365/145; 365/149; 365/226
[58] Field of Search .............. 365/182, 189.01, 230.01, 365/145, 149, 226, 227

[56] References Cited

U.S. PATENT DOCUMENTS 5,357,460 10/1994 Yusuki et al. ...................... 365/145

Primary Examiner—Terrell W. Fears
Attorney, Agent, or Firm—Antonelli, Terry, Stout & Kraus

[57] ABSTRACT

A ferroelectric capacitor and another ferroelectric capacitor or dielectric capacitor have one of their electrodes commonly connected to an address selection switching element with its gate connected to a word line and the other of their electrodes connected to first and second plate voltage supply line, respectively. Two operation modes are provided. A first operation mode has a first voltage supplied to a first plate voltage supply line and a second voltage to a second plate voltage supply line. A second operation mode has the second voltage supplied to the first plate voltage supply line and the first voltage to the second plate voltage supply line.

10 Claims, 18 Drawing Sheets

FIG. 1
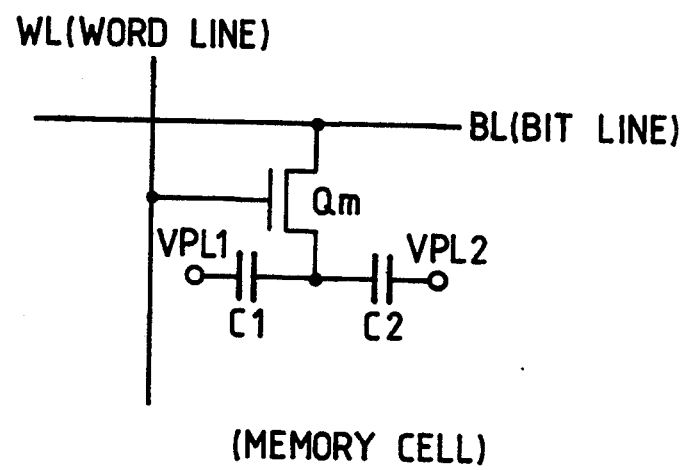
(MEMORY CELL)
FIG. 2A
FIG. 2B
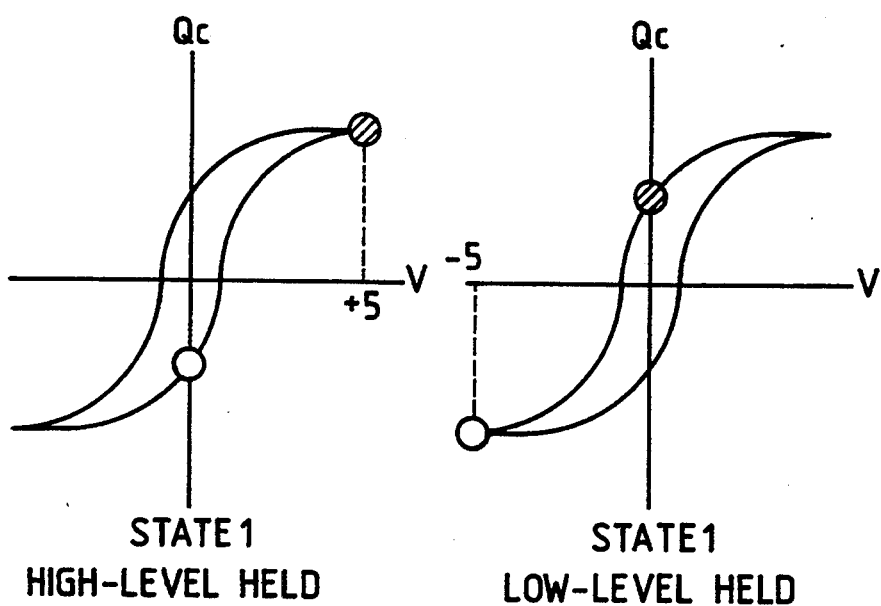
STATE 1
HIGH-LEVEL HELD
STATE 1
LOW-LEVEL HELD (MEMORY CELL)

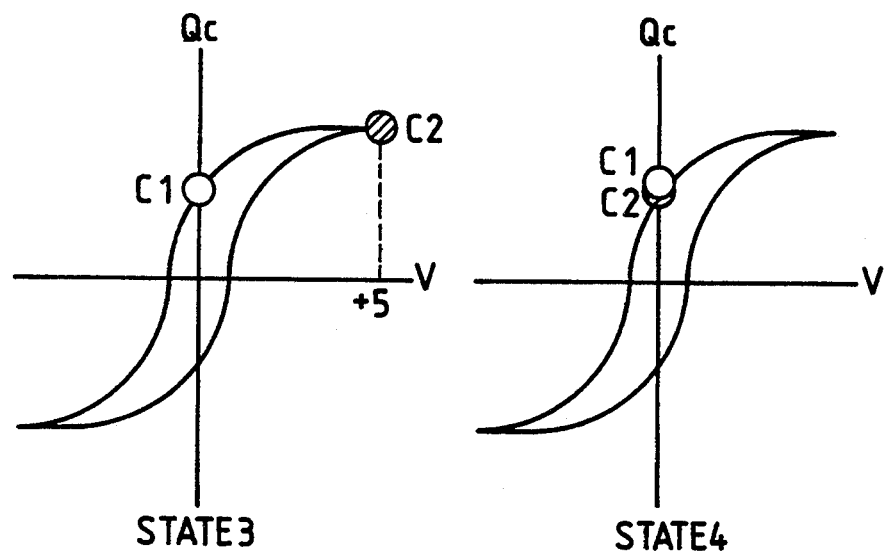
FIG. 13A STATE3
FIG. 13B STATE4
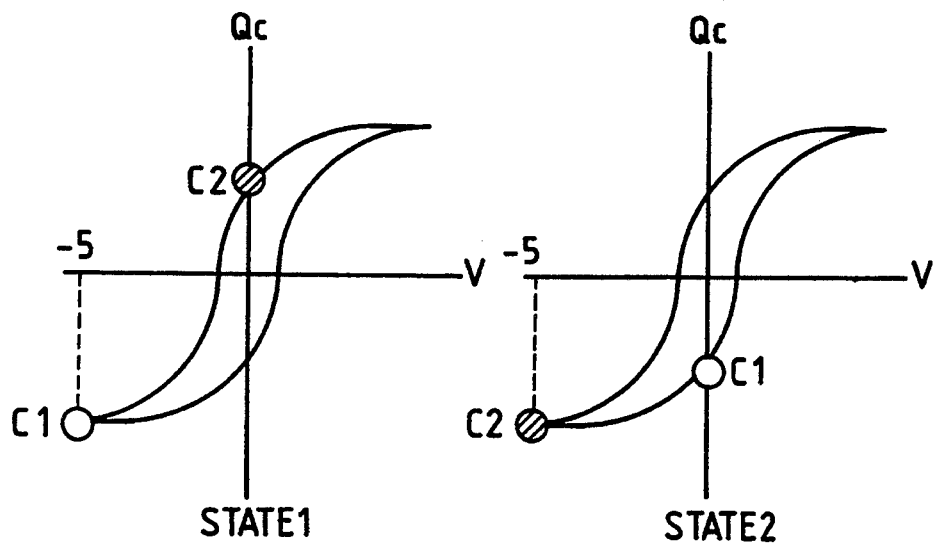
FIG. 14A STATE1
FIG. 14B STATE2

FIG. 15A
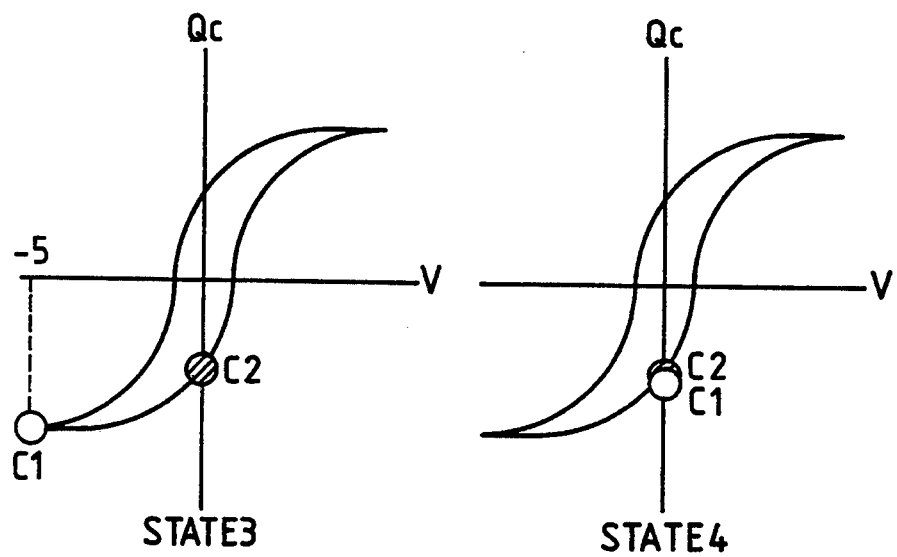
FIG. 15B
FIG. 16
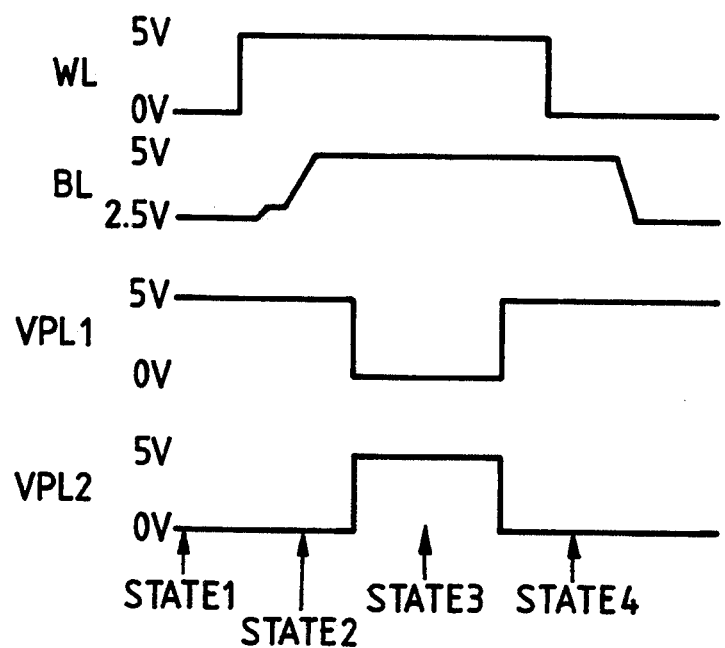

STATE 1

STATE 2

STATE 3

STATE 4

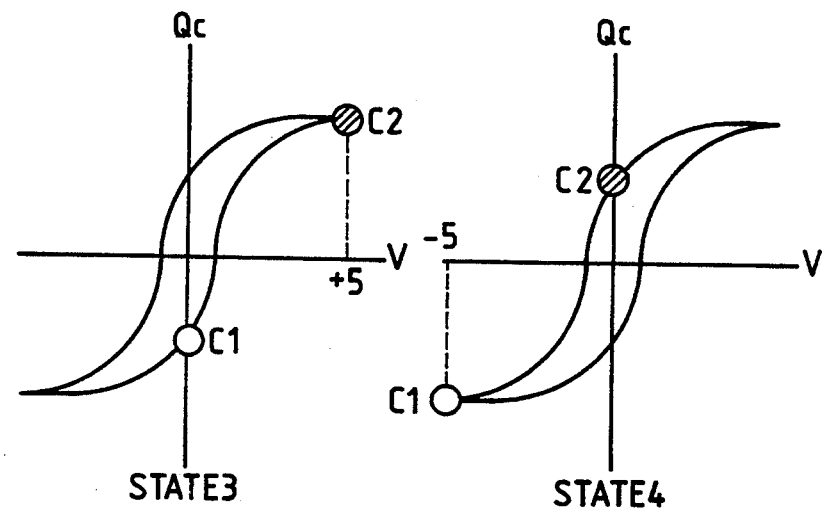
FIG. 21A  STATE3
FIG. 21B  STATE4
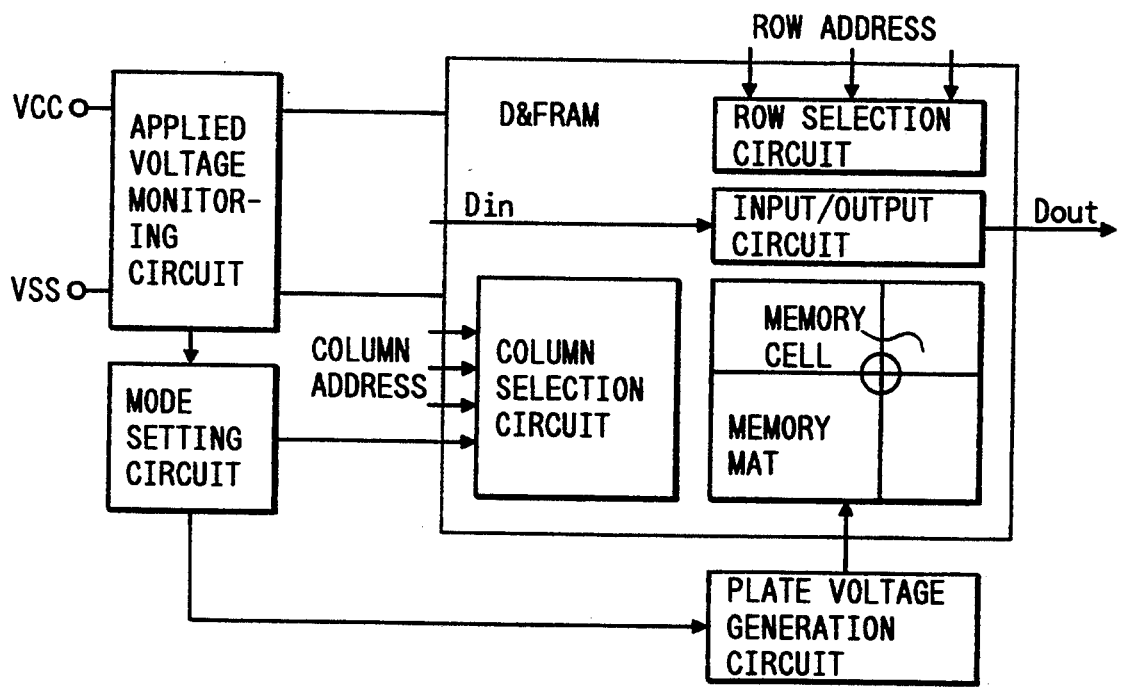
FIG. 22

5,383,150

SEMICONDUCTOR MEMORY DEVICE

BACKGROUND OF THE INVENTION

The present invention relates to a semiconductor memory device and an information processing system using it, and more particularly to a technique suitably applied to a semiconductor memory device and an information processing system in which ferroelectric capacitors are used as part of memory cells.

U.S. Pat. No. 4,873,664 and U.S. Ser. No. 07/546,854, Jul. 2, 1990 are cited as examples using ferroelectric capacitors as memory cells.

SUMMARY OF THE INVENTION

The inventor of this invention has devised a semiconductor memory device which uses ferroelectric capacitors to enable switching from a DRAM (dynamic RAM) mode to an FRAM (ferroelectric memory) mode, as well as an information processing system using such a memory device.

An object of this invention is to provide a novel semiconductor memory device which is simple in construction and realizes an instantaneous switching from the DRAM mode to the FRAM mode.

Another object of this invention is to provide an information processing system equipped with easily manipulated memory devices.

These and other objects and novel features of this invention will become apparent from the following description in this specification and the accompanying drawings.

A representative aspect of this invention disclosed in this specification is briefly described as follows. That is, a ferroelectric capacitor and another ferroelectric capacitor or dielectric capacitor have one of their electrodes commonly connected to an address selection switching element with its gate connected to a word line and the other of their electrodes connected to first and second plate voltage supply line, respectively. Two operation modes are provided. A first operation mode has a first voltage supplied to a first plate voltage supply line and a second voltage to a second plate voltage supply line. A second operation mode has the second voltage supplied to the first plate voltage supply line and the first voltage to the second plate voltage supply line. With the above-mentioned means, in the first operation mode, the ferroelectric capacitors are supplied with a voltage of one direction or 0 V according to the write information from the data line, so that the polarization of the capacitors is not reversed, allowing the memory cell to act as a DRAM. In the second operation mode, however, the polarization is reversed according to the information stored in each memory cell, permitting an instantaneous writing of all memory cells as FRAM.

BRIEF DESCRIPTION OF THE DRAWINGS

FIG. 1 is a circuit diagram showing one embodiment of a memory cell according to this invention;

FIG. 2A and FIG. 2B are hysteresis characteristic diagrams showing the relationship between polarization Qc of a ferroelectric film and voltage V during an operation mode in which the memory cell of FIG. 1 is used as the dynamic memory cell;

FIG. 13A and FIG. 13B are hysteresis characteristic diagrams of the ferroelectric capacitor showing a part of the operation of FIG. 11;

FIG. 14A and FIG. 14B are hysteresis characteristic diagrams of the ferroelectric capacitor showing a part of the operation of FIG. 11;

FIG. 15A and FIG. 15B are hysteresis characteristic diagrams of the ferroelectric capacitor showing a part of the operation of FIG. 11;

FIG. 16 is a waveform diagram showing the switching operation from the FRAM mode to the DRAM mode when there are positive residual polarizations in the capacitors C1 and C2 of the memory cell according to this invention;

FIG. 21A and FIG. 21B are hysteresis characteristic diagrams of the ferroelectric capacitor showing the remaining part of the operation of FIG. 19;

FIG. 22 is a block diagram showing one example circuit including a semiconductor memory device using the memory cells of this invention and a peripheral, external circuit for the memory device;

DETAILED DESCRIPTION OF THE PREFERRED EMBODIMENTS

Figure 3:
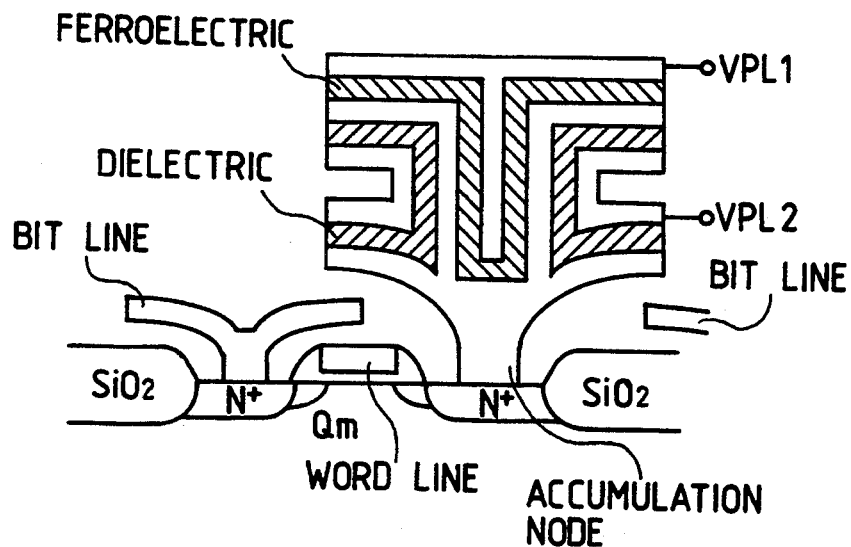
FIG. 3 is a cross section of one embodiment of the memory cell according to this invention.

FIG. 1 shows a circuit of a memory cell as one embodiment of this invention. The circuit elements in the diagram are formed on a single semiconductor substrate such as a monocrystalline silicon by a known semiconductor integrated circuit fabrication technoloqy.

A switch MOSFET Qm for address selection has its gate connected to a word line WL extending in a vertical direction. One of source and drain of the MOSFET Qm is connected to a bit line BL (also called a data line or digit line) extending horizontally. The other of source and drain of the MOSFET Qm is connected commonly to one of electrodes of each capacitors C1 and C2. The second electrode of the capacitor C1 is supplied a plate voltage VPL1 and the second electrode of the capacitor C2 a plate voltage VPL2.

The plate voltages VPL1 and VPL2 are supplied through plate voltage supply lines leading from external terminals. On the semiconductor substrate a plurality of such memory cells as described above are arranged in matrix at intersections between the word lines and the bit lines. All the memory cells have their capacitors, similar to the capacitors C1 and C2, connected to the plate voltage supply lines carrying the plate voltages VPL1 and VPL2. The plate voltages VPL1 and VPL2 for the memory cells therefore are supplied through the external terminals.

At least one of the two capacitors C1 and C2 is formed of a ferroelectric capacitor. The capacitors C1 and C2 may both be formed of the ferroelectric capacitors. The ferroelectric capacitor is formed by using a ferroelectric such as PZT.

In an operation mode where this memory cell is to be used as a dynamic memory cell, the plate voltage VPL1 for one capacitor C1 is set to a ground potential of the circuit while the plate voltage VPL2 for the other capacitor C2 is set to a supply voltage, say, 5 V.

FIG. 2A and FIG. 2B are hysteresis characteristic diagrams showing the relation between the polarization Qc of a ferroelectric film and the voltage V during an operation mode in which the memory cell is used as the dynamic memory cell. FIG. 2A represents the state where a high level (5 V) is held and FIG. 2B represents the state where a low level (0 V) is held. In both characteristics shown, the capacitors C1 and C2 are both ferroelectric capacitors.

In the state of FIG. 2A, a high level (5 V) is written into the memory cell from the bit line and is maintained. That is, the capacitor C1 with the plate voltage VPL1 set to the ground potential of the circuit is supplied a +5 V as seen from an accumulation node connected to the switch MOSFET Qm, so that there is a positive polarization corresponding to the shaded circle on the hysteresis characteristic. At this time, the capacitor C2 is supplied +5 V at both electrodes and has a negative residual polarization corresponding to a blank circle on the hysteresis.

In the state of FIG. 2B, a low level (0 V) is written into from the bit line and is held. In this case, since the capacitor C1 whose plate voltage VPL1 is set to the ground potential of the circuit is supplied 0 V as seen from the accumulation node connected to the switch MOSFET Qm, it is at a residual polarization corresponding to the shaded circle on the hysteresis characteristic. On the contrary, the capacitor C2 whose plate voltage VPL2 is set to the supply voltage is supplied −5 V as seen from the accumulation node connected to the switch MOSFET Qm, so that it is negatively polarized as indicated by a blank circle on the hysteresis characteristic.

In this way, in the operation mode of the dynamic memory cell, the capacitors C1 and C2 will each assume only one of the positive, negative and residual polarizations in response to the high or low level of the write signal, i.e. the polarization is not reversed. This prevents a deterioration in the insulation film characteristic and therefore a possible degradation of dielectric constant that would otherwise accompany it.

FIG. 3 shows the structural cross section of one embodiment of the memory cell according to this invention. In the figure, a ferroelectric capacitor is stacked over the capacitor of a known dynamic memory cell. That is, in the cell making region enclosed by a field insulating film $SiO_2$, the source and drain made of an N+ layer that form the address selection MOSFET Qm are formed, and one of the source and drain is formed with a capacitor of fin structure. This capacitor is formed of an ordinary dielectric in a way similar to that in which a known dynamic memory cell is manufactured. The other electrode of the capacitor is supplied the plate voltage VPL2.

In this embodiment, on the ordinary dielectric capacitor is provided a ferroelectric capacitor, which uses a ferroelectric as an insulating film and has one of its electrodes connected as a common accumulation node to one electrode of the underlying capacitor. The other electrode of the ferroelectric capacitor is supplied the plate voltage VPL1. It is convenient in terms of ease of manufacture to use a ferroelectric film for the insulating film of the overlying capacitor portion. This is because when the ferroelectric film is used as an insulating film, a metal film may be formed between the accumulation node and the insulating film to limit a leakage current, in which case the above-mentioned structure is advantageous.

Figure 4:
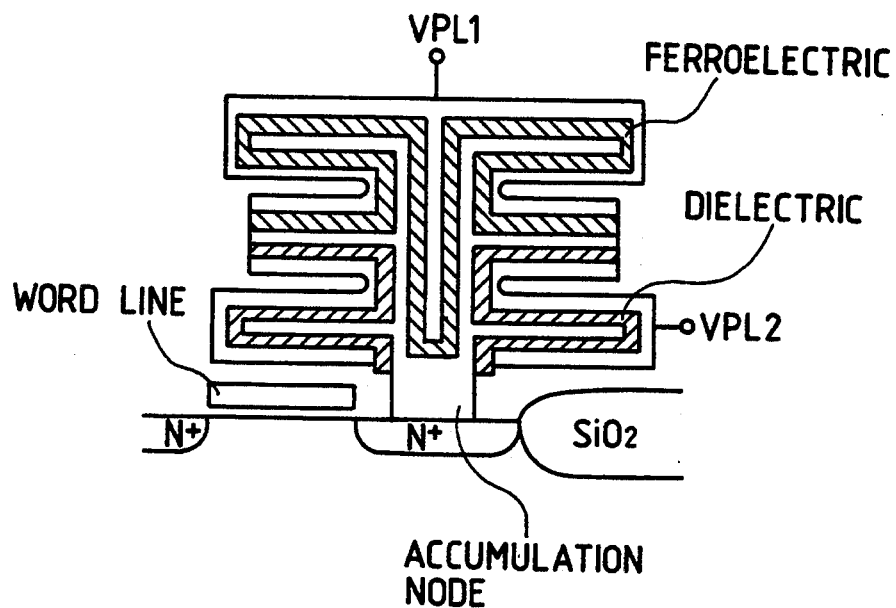
FIG. 4 is a cross section of another embodiment of the memory cell according to this invention.

FIG. 4 shows the structural cross section of another embodiment of the memory cell according to this invention. In the figure, when the ferroelectric capacitor is to be stacked over the capacitor of the known dynamic memory cell, the both capacitors are formed in the fin structure. The use of such a construction results in a greater capacitance in a virtually smaller occupied area.

Figure 5:
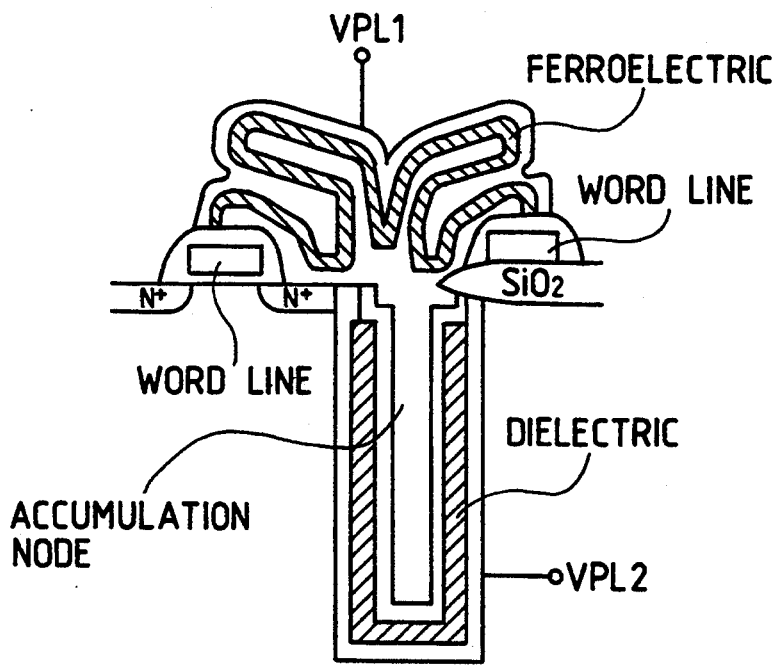
FIG. 5 is a cross section of still another embodiment of the memory cell according to this invention.

FIG. 5 shows the structural cross section of still another embodiment of the memory cell according to this invention. As shown in the figure, when the ferroelectric capacitor is to be stacked on the capacitor of a known dynamic memory cell, the capacitor for the dynamic memory cell is made in a trench configuration and the ferroelectric capacitor stacked on it is formed in a fin configuration. Such a construction prevents an increase in the number of stacked layers.

The process of making the above-mentioned memory cell is outlined below. A field insulating film $SiO_2$ is formed leaving a diffused layer to be used for forming a memory cell. Below the field insulating film $SiO_2$ is formed a P-type channel stopper, which is not shown. Over the surface of the cell forming region enclosed by the field insulating film $SiO_2$ is formed a thin gate insulating film, on which a gate electrode (word line) of polysilicon or polyside is formed. With the gate electrode and the field insulating film $SiO_2$ used as a mask, an N+ type diffused layer is formed which constitutes the source and drain of an N-channel MOSFET. In a P-channel MOSFET that makes up a CMOS circuit, a P+ type diffused layer 10 constituting source and drain is formed in a separate process. Over the gate insulating film is formed a CVD-$SiO_2$ as an interlayer insulating film.

Though not shown, the gate electrode is formed with a side wall of CVD-$SiO_2$, and an interlayer insulating film of CVD-$SiO_2$ is also formed. At an area corresponding to the source and drain of a transfer MOSFET, an opening is formed, where electrodes for the bit line and the accumulation node are then formed.

The ferroelectric capacitor is formed as follows. A ferroelectric such as PZT is deposited, according to a known method, on the electrode that forms the accumulation node of the capacitor of the dynamic memory cell. Then, an upper electrode of Pt is formed over the ferroelectric. The ferroelectric may be $BaMgF_4$. Detailed description on the formation of such ferroelectric layers may be found in the journal "Semiconductor World" December issue 1991, pp. 122–125.

Before proceeding to the description on the operation of the memory cell of this invention, the switching from the DRAM mode to the FRAM mode of a memory cell using a single ferroelectric capacitor will be explained by referring to FIG. 6 through FIG. 10 to facilitate understanding of the memory cell operation.

Figure 6:
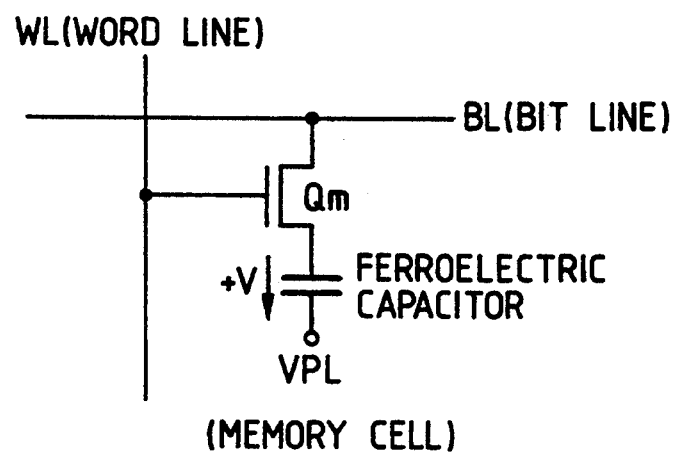
FIG. 6 is a circuit diagram of the memory cell using one ferroelectric capacitor.

FIG. 6 shows the circuit of a memory cell using a single ferroelectric capacitor. The memory cell in the figure is formed by using basically the same ferroelectric capacitor as used in the known dynamic memory cell, except that the plate voltage VPL is varied depending on the operation mode rather than being fixed. The direction of polarization of the ferroelectric capacitor as viewed from the switch MOSFET Qm, i.e. the accumulation node side, is taken to be positive as indicated by the arrow in the drawing.

Figure 7:
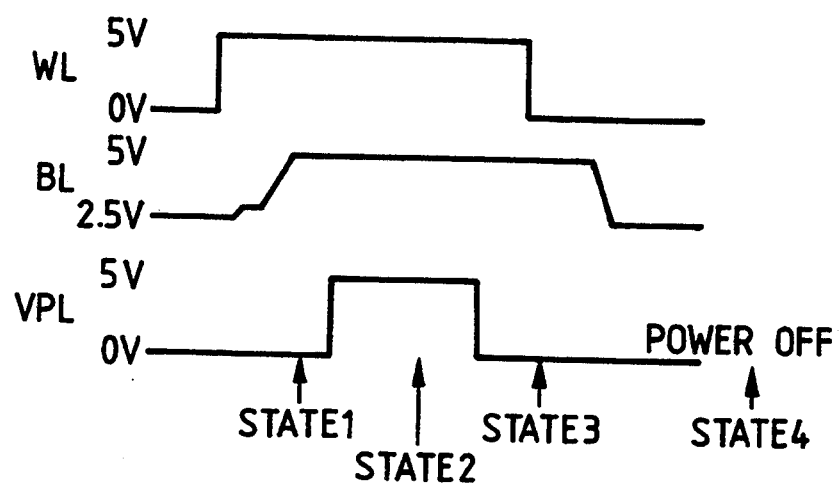
FIG. 7 is a waveform diagram showing one example of operation in which the memory cell of FIG. 6 that stores a high level is made nonvolatile.
Figures 8A, 8B:
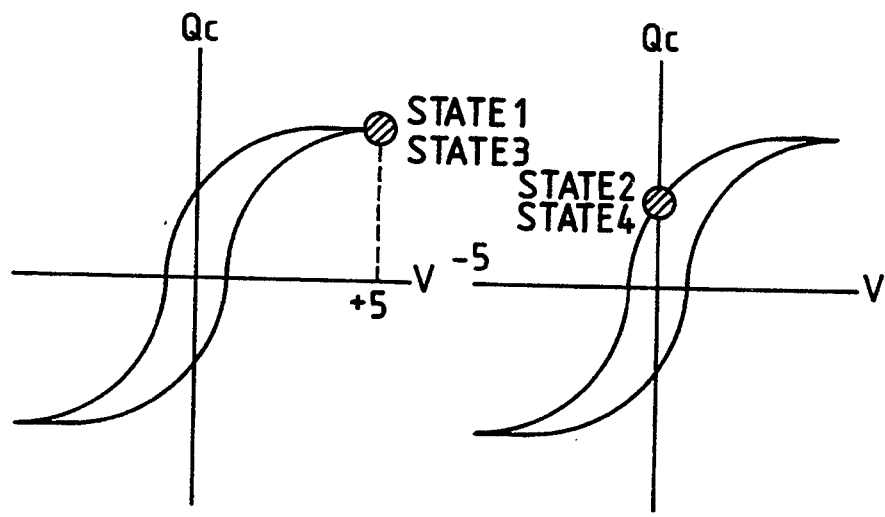
FIG. 8A and FIG. 8B are hysteresis characteristic diagrams showing the polarization of the ferroelectric film that correspond to the operation shown in FIG. 7.

FIG. 7 shows the operation waveforms when the memory cell storing a high level is made nonvolatile. FIG. 8A and FIG. 8B show the polarizing behavior in the hysteresis characteristic of the ferroelectric film. With a high level stored in the memory cell, when a word line is selected, minute memory information appearing on the bit line BL is amplified by a sense amplifier to a high level of 5 V as in the case of the refreshing operation. In this state, as indicated by a State 1 in FIG. 8A, the ferroelectric film has a polarization corresponding to 5 V.

With the bit line BL set to the high level, the plate voltage VPL is changed to the same high level of 5 V. In this State 2, because the ferroelectric film is supplied the same potentials, the resulting polarization in the film corresponds to a polarization that would occur when it is applied the voltage of 0 V, as shown in FIG. 8B.

When the plate voltage VPL is returned to the original low level, 5 V is again applied to the ferroelectric film causing the polarization represented by the State 3. Even when the word line WL is set to a low level for deselection, this polarization is maintained by the voltage held in the accumulation node.

Then, when a power supply is cut off, current leakage causes the accumulation node potential to decrease until the ferroelectric film is no longer applied a voltage, at which time the ferroelectric film has a residual polarization as indicated by the State 4 in FIG. 8B.

Figure 9:
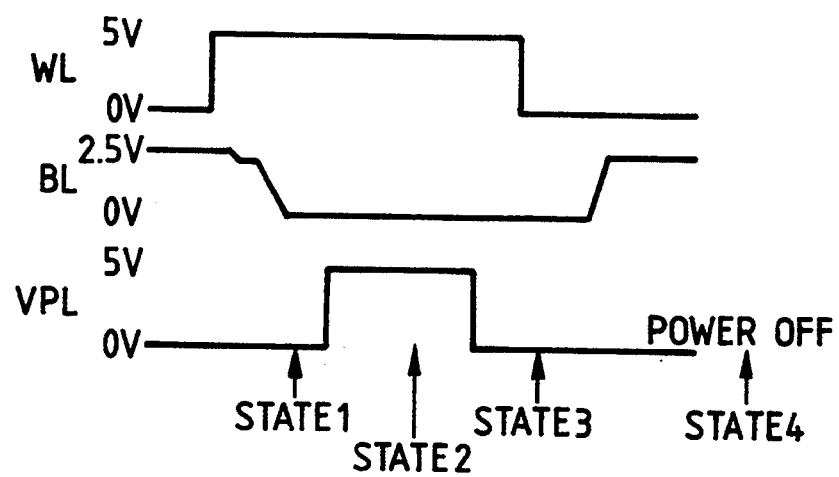
FIG. 9 is a waveform diagram, showing one example of operation in which the memory cell of FIG. 6 that stores a low level is made nonvolatile.
Figures 10A, 10B:
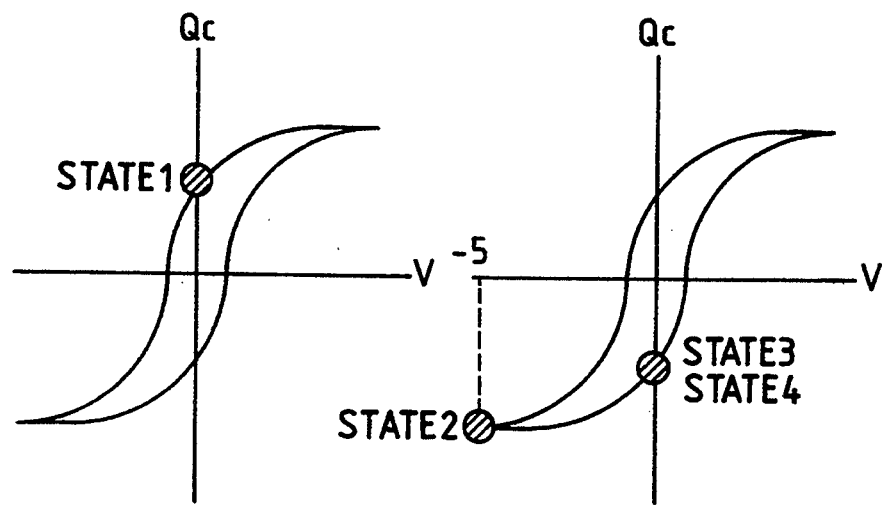
FIG. 10A and FIG. 10B are hysteresis characteristic diagrams showing the polarization of the ferroelectric film that correspond to the operation shown in FIG. 9.

FIG. 9 shows the operation waveforms when the memory cell storing a low level is made nonvolatile. FIG. 10A and FIG. 10B show the polarizing behavior in the hysteresis characteristic of the ferroelectric film. With a low level stored in the memory cell, when the word line is selected, minute memory information appearing on the bit line BL is amplified by the sense amplifier to a low level of 0 V as in the case of the refreshing operation. In this state, because the ferroelectric film is applied the same voltages of 0 V, the ferroelectric film has a polarization corresponding to the one that would occur when it is applied 0 V, as indicated by a State 1 in FIG. 10A.

With the bit line BL set to the low level, the plate voltage VPL is changed to the high level of 5 V. In this State 2, because the ferroelectric film is supplied $-5$ V, as seen from the accumulation node, the polarization in the film is such as will occur when it is applied the voltage of $-5$ V, as indicated by the State 2 in FIG. 10B. In other words the polarization reverses.

When the plate voltage VPL is returned to the original low level, the ferroelectric film is applied the same voltages of 0 V. Because the polarization has been reversed, the ferroelectric film has a negative, not positive, residual polarization as indicated by the State 3. Even when the word line WL is set to a low level for deselection, this polarization is maintained by the voltage of 0 V held in the accumulation node. When the power supply is cut off, the ferroelectric film is similarly applied with no voltage, so that the film retains the negative residual polarization as shown at the State 4 in FIG. 10B.

When power is supplied to perform the refreshing operation, a minute high level or low level with respect to a half precharge voltage of 2.5 V as the reference voltage is output to the bit line according to the residual polarization and is amplified by the sense amplifier. The ferroelectric capacitor is then written again with the high level or low level, making the orientation of polarization distinct as at the State 1 of FIG. 8A and the State 3 of FIG. 8A to hold the stored information.

When a single ferroelectric capacitor is used as described above, it is necessary to perform switching from the DRAM mode to the FRAM mode a word line at a time by utilizing the refreshing operation. In the event that the power supply for the memory device is interrupted by unexpected power failure or erroneous power switch operation, the switching from the DRAM mode to the FRAM mode to make the memory device nonvolatile will take time. Hence, a separate power supply dedicated for the switching is required, making the memory device less easy to manipulate.

Figure 11:
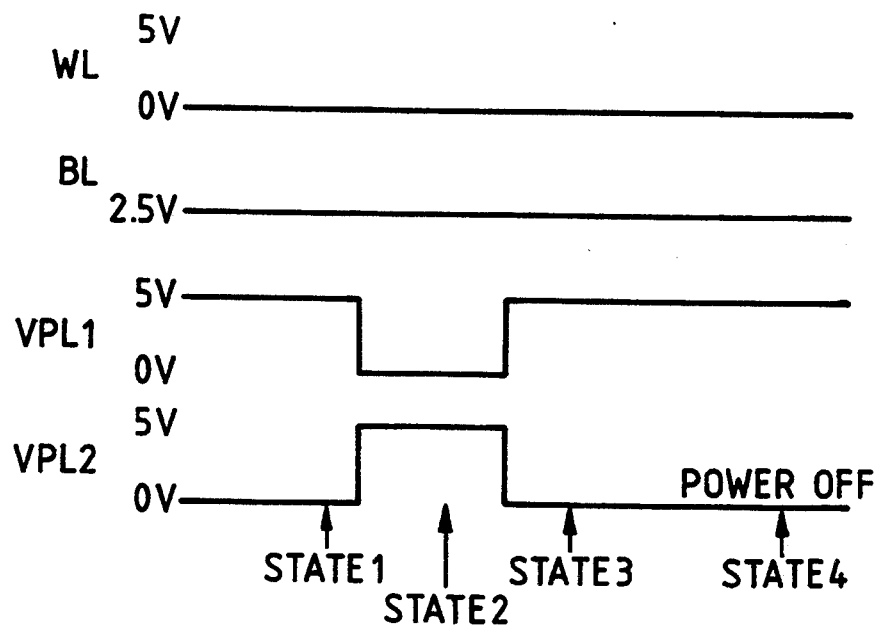
FIG. 11 is a waveform diagram showing the switching operation from the DRAM mode to the FRAM mode when the memory cell of this invention holds a high level.

FIG. 11 shows waveforms used to explain one example of switching operation from the DRAM mode to the FRAM mode of the memory cell of this invention. FIGS. 12A, 12B, 13A and 13B show hysteresis diagrams of the ferroelectric capacitor during the switching operation.

In this embodiment, the capacitors C1 and C2 in the memory cell of FIG. 1 are both ferroelectric capacitors. The plate voltage VPL1 is supplied 5 V for normal operation and the plate voltage VPL2 the circuit ground potential of 0 V.

Figures 12A, 12B:
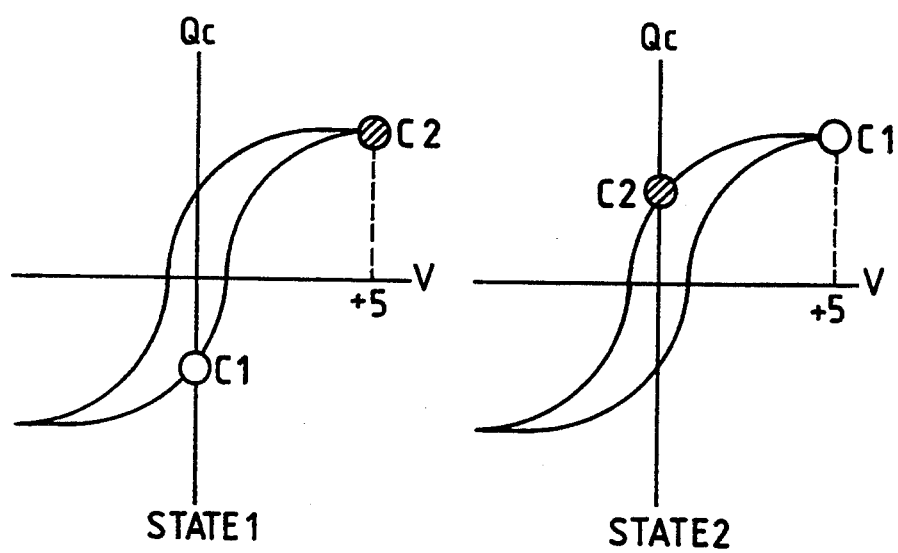
FIG. 12A and FIG. 12B are hysteresis characteristic diagrams of the ferroelectric capacitor showing a part of the operation of FIG. 11.

In FIG. 11, the State 1 represents the operation in the DRAM mode. In this condition, the plate voltage VPL1 is set at 5 V and the plate voltage VPL2 at 0 V. With the word line deselected and the accumulation node of the memory cell storing a high level, the capacitor C2 connected to the plate voltage VPL2 has a polarization that corresponds to the applied voltage of 5 V, as shown in FIG. 12A. On the other hand, the capacitor C1 connected to the plate voltage VPL1 is supplied 5 V at both electrodes, i.e. it has a voltage difference of 0 V. Hence, it has a negative residual polarization that follows the reversal of polarization which occurred when a low level was written into the accumulation node.

In the stored information holding state, the plate voltages VPL1 and VPL2 are each reversed, as indicated by the State 2 in FIG. 11. That is, the plate voltage VPL1 is changed from 5 V to 0 V and the plate voltage VPL2 from 0 V to 5 V. The plate voltages VPL1 and VPL2 may be formed by using a CMOS inverter circuit, which performs complementary switching by one control signal supplied from outside.

In a semiconductor memory device, for example, the plate voltages can easily be realized by providing the memory device with a mode switching control terminal for receiving a mode switching signal, and providing the internal circuit with a CMOS inverter circuit which switches the plate voltages VPL1 and VPL2 complementarily between the supply voltage and the circuit ground potential.

Rather than providing an additional control terminal, it is possible to form a switch-to-FRAM mode control signal by combining existing control terminals present in the DRAM. For example, the FRAM mode may be defined as a write enable signal WE and a column address strobe signal going low before a row address strobe signal RAS goes low. In memory devices having an output enable signal OE, this signal may also be used in defining the FRAM mode. The FRAM mode signal may also be formed by combining the above-mentioned operation mode control signals and the address signals or data signals.

In the State 2, as shown in FIG. 12B, the capacitor C1 connected to the plate voltage VPL1, which was changed from 5 V to 0 V, is applied 5 V, as seen from the side of the accumulation node storing a high level. This causes the capacitor C1 to change from the negative residual polarization to a polarization corresponding to the applied voltage of 5 V, following the hysteresis curve. The capacitor C2 connected to the plate voltage VPL2, which was changed from 0 V to 5 V, is applied 5 V at both electrodes so that the voltage difference is 0 V. This causes the capacitor C2 to change to a positive residual polarization.

The plate voltages VPL1 and VPL2 are returned to their original states as shown by the State 3 in FIG. 11. That is, the plate voltage VPL1 is changed from 0 V to 5 V and the plate voltage VPL2 from 5 V to 0 V. In other words, the State 2 switches the voltage levels of the plate voltages VPL1 and VPL2 complementarily in response to a one-shot pulse.

At the State 3, as shown in FIG. 13A, the capacitor C1 connected to the plate voltage VPL1, since it has undergone the reversal of polarization, now moves to a positive residual polarization, which differs from the polarization found in the State 1. The capacitor C2, which has not undergone the polarization reversal, returns to a polarization corresponding to the voltage 5 V held in the accumulation node.

When the power supply is interrupted as at the State 4 in FIG. 11, the plate voltage VPL1 changes to 0 V by discharge. Hence, the capacitors C1 and C2 are both at the positive residual polarization, as shown in FIG. 13B.

When, in the DRAM mode at the State 1, the word line is deselected and the accumulation node of the memory cell stores a low level, the capacitor C1 connected to the plate voltage VPL1 produces a polarization corresponding to the applied voltage of $-5$ V, as seen from the accumulation node side. This is shown in FIG. 14A. The capacitor C2 connected to the plate voltage VPL2 has its both electrodes applied with 0 V so that the voltage difference is 0 V. Hence, it has a positive residual polarization that follows the reversal of polarization which occurred when a high level was written into the accumulation node. If a high level has not yet been written into at all, however, the capacitor C2 will have a negative residual polarity.

In the stored information holding state described above, when the plate voltages VPL1 and VPL2 are each reversed as in the State 2 in FIG. 11, the capacitor C2 connected to the plate voltage VPL2, which was changed from 0 V to 5 V, is applied $-5$ V, as seen from the side of the accumulation node storing the low level. This causes the capacitor C2 to change from the positive residual polarization to a polarization corresponding to the applied voltage of $-5$ V, following the hysteresis curve. This is shown in FIG. 14B. If the capacitor C2 is in a negative residual polarization, it will change to a polarization corresponding to the applied voltage of $-5$ V without reversing the polarization. On the other hand, the capacitor C1 connected to the plate voltage VPL1, which was changed from 5 V to 0 V, is applied 0 V at both electrodes so that the voltage difference is 0 V. This causes the capacitor C1 to change to a negative residual polarization.

When the plate voltages VPL1 and VPL2 are returned to their original states, as in the State 3 in FIG. 11, the capacitor C2 connected to the plate voltage VPL2, since it has undergone the reversal of polarization, now moves to a negative residual polarization, which differs from the polarization found in the State 1. This is shown in FIG. 15A. The capacitor C1, which has not undergone the polarization reversal, returns to a polarization corresponding to the applied voltage of $-5$ V because of the 0 V held in the accumulation node.

When the power supply is interrupted as at the State 4 in FIG. 11, the plate voltage VPL1 changes to 0 V by discharge. Hence, the capacitors C1 and C2 are both at the negative residual polarization, as shown in FIG. 15B.

The switching from the above-mentioned DRAM mode to the FRAM mode is performed simultaneously for all memory cells supplied with such plate voltages VPL1 and VPL2 as described above. Therefore, by commonly connecting the plate voltages of the paired capacitors in all memory cells to VPL1 and VPL2, respectively, it is possible to switch all the memory cells from the DRAM mode to the FRAM mode instantaneously.

In switching from the DRAM mode to the FRAM mode, it is also possible to cut off power supply immediately after producing the State 1 and the State 2. In other words, the operation to make the memory cells nonvolatile by bringing the ferroelectric capacitors to residual polarizations can be done by interrupting the power supply without passing through the State 3.

Next, the operation for switching the memory cells from the FRAM mode to the DRAM mode will be described. FIG. 16 shows operation waveforms when the capacitors C1 and C2 are at the positive residual polarization as in the state of FIG. 13B. FIGS. 17A, 17B, 18A and 18B show hysteresis diagrams of the ferroelectric capacitors during the switching operation.

The switching from the FRAM mode to the DRAM mode is carried out by utilizing the refreshing operanion. That is, as shown in FIG. 16, at the State 1 power is turned on and various potentials are set to the desired value. The plate voltage VPL1 is set to 5 V, the plate voltage VPL2 to 0 V, and the bit line BL to the half precharge voltage of 2.5 V. In this state the word line is left deselected, so that the capacitors C1 and C2 remain uncharged and therefore stay in the residual polarization.

Figure 17A:
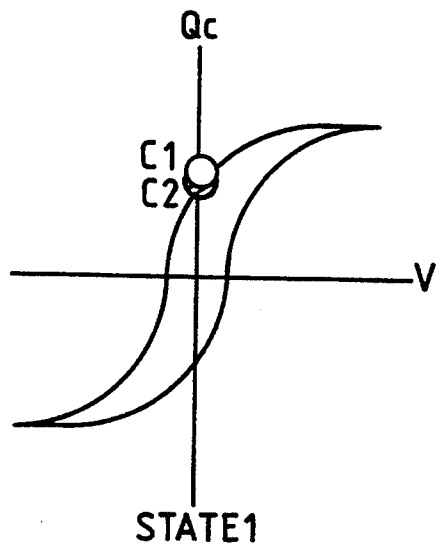
FIG. 17A and FIG. 17B are hysteresis characteristic diagrams of the ferroelectric capacitor showing a part of the operation of FIG. 16.
Figure 17B:
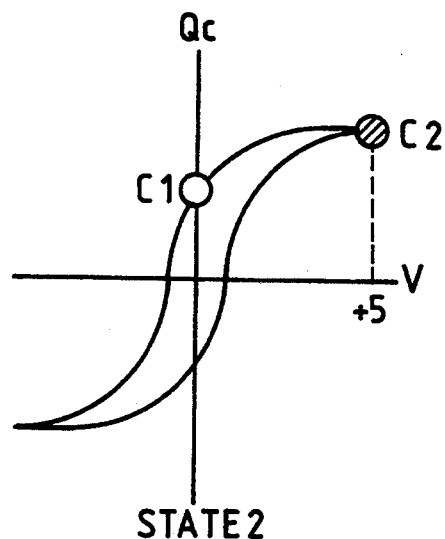

In the State 2, the refreshing operation is started and one word line is selected. With the capacitors C1 and C2 in the positive residual polarization, when the address selection switch MOSFET Qm is turned on to select a word line, a small voltage on the high-level side appears on the bit line BL. This small potential on the bit line BL is amplified by the sense amplifier to a high level of, say, 5 V. As a result, as shown in FIG. 17B, the capacitor C2 connected to the plate voltage VPL2 has a polarization corresponding to 5 V and the capacitor C1 connected to the plate voltage VPL1 remains in the positive residual polarization.

Figure 18A:
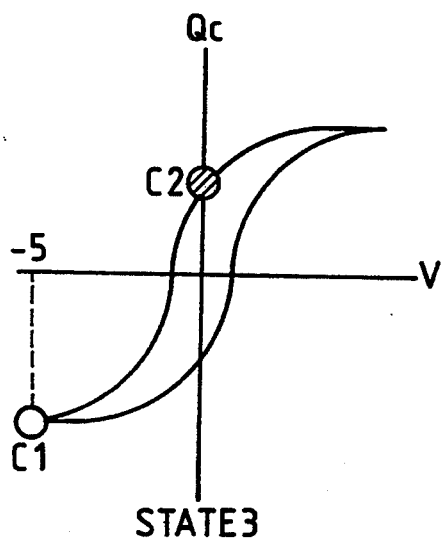
FIG. 18A and FIG. 18B are hysteresis characteristic diagrams of the ferroelectric capacitor showing the remaining part of the operation of FIG. 16.

In the State 3, the plate voltages VPL1 and VPL2 are each reversed, with the word line remaining selected. That is, as described earlier, the plate voltage VPL1 is changed from 5 V to 0 V and the plate voltage VPL2 from 0 V to 5 V. As a result, as shown in FIG. 18A, the capacitor C1 reverses its polarization to the one corresponding to −5 V. The capacitor C2, since it is applied 5 V at both electrodes, has a voltage difference of 0 V and hence a positive residual polarization.

Figure 18B:
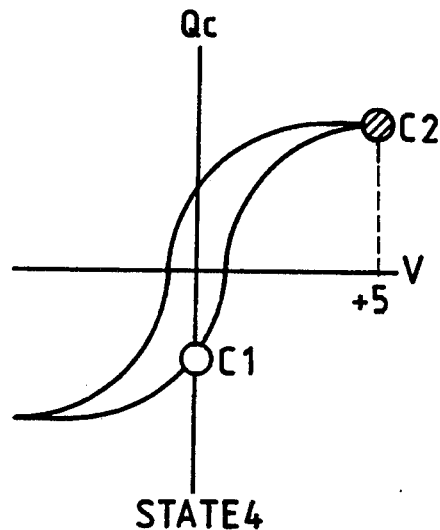

In the State 4, the plate voltages VPL1 and VPL2 are returned to their original states. That is, the plate voltage VPL1 of the DRAM mode is changed to 5 V and the VPL2 of the DRAM mode to 0 V. This causes the capacitor C1 to move to a negative residual polarization and the capacitor C2 to a polarization corresponding to 5 V, as shown in FIG. 18B. This state is similar to the one shown in FIG. 12A.

Figure 19:
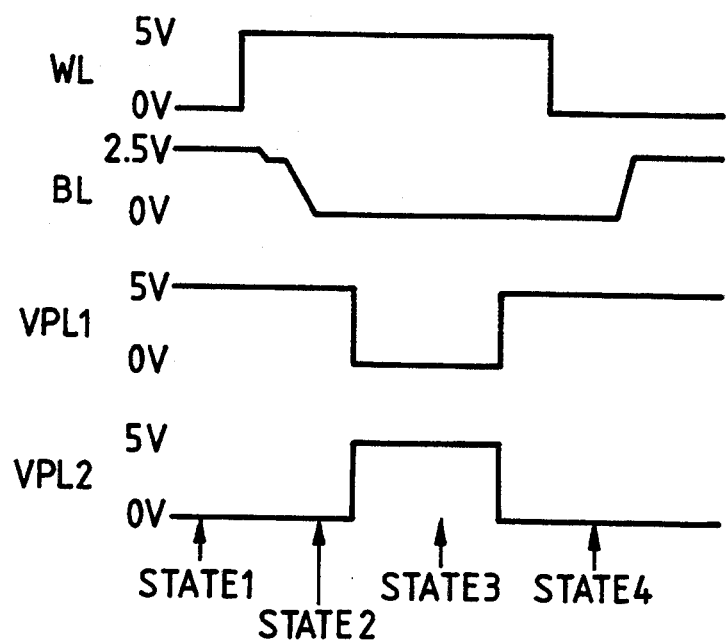
FIG. 19 is a waveform diagram showing the switching operation from the FRAM mode to the DRAM mode when there are negative residual polarizations in the capacitors C1 and C2 of the memory cell according to this invention.

FIG. 19 shows the operation waveforms when the capacitors C1 and C2 are in the negative residual polarization as shown in FIG. 14B. FIGS. 20A, 20B, 21A and 21B show the hysteresis diagrams of the ferroelectric capacitors.

As mentioned earlier, in the State 1 the power supply is turned on to set the plate voltage VPL1 to 5 V, the plate voltage VPL2 to 0 V and the bit line BL to the half precharge voltage of 2.5 V. In this state, since the word line remains unselected, the capacitors C1 and C2 are not charged, maintaining the residual polarization state.

Figures 20A, 20B:
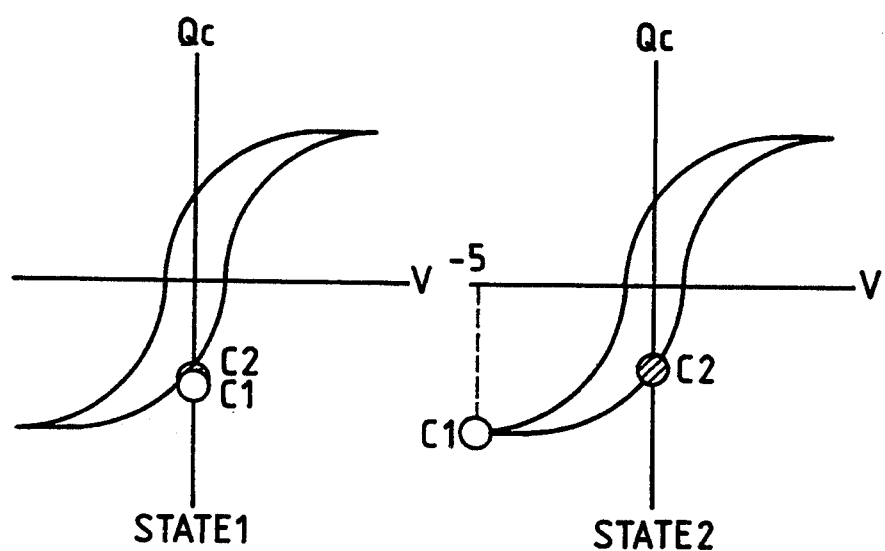
FIG. 20A and FIG. 20B are hysteresis characteristic diagrams of the ferroelectric capacitor showing a part of the operation of FIG. 19.

In the State 2, the refreshing operation is started to select one word line. With the capacitors C1 and C2 in the negative residual polarization, when the address selection switch MOSFET Qm is turned on to select a word line, a small voltage on the low-level side appears on the bit line BL. This small potential on the bit line BL is amplified by a sense amplifier to a low level of, say, 0 V. As a result, as shown in FIG. 20B, the capacitor C1 connected to the plate voltage VPL1 has a polarization corresponding to −5 V and the capacitor C2 connected to the plate voltage VPL2 remains in the negative residual polarization.

In the State 3, the plate voltages VPL1 and VPL2 are each reversed, with the word line selected. That is, as mentioned earlier, the plate voltage VPL1 is changed from 5 V to 0 V and the plate voltage VPL2 from 0 V to 5 V. This causes the capacitor C2 to reverse its polarization from the negative residual polarization to a polarization corresponding to 5 V. The capacitor C1, since its both electrodes are applied 0 V, has the voltage difference of 0 V and hence the negative residual polarization, as shown in FIG. 21C.

In the State 4, the plate voltages VPL1 and VPL2 are returned to their original states. That is, the plate voltage VPL1 of the DRAM mode is changed to 5 V and the VPL2 of the DRAM mode to 0 V. This causes the capacitor C2 to move to a positive residual polarization and the capacitor C1 to a polarization corresponding to −5 V, as shown in FIG. 21B. This state is similar to the one shown in FIG. 14A.

Switching from the FRAM mode to the DRAM mode can be done by performing the above-mentioned operations for all word lines. That is, in synchronism with the refreshing operation, the plate voltages VPL1 and VPL2 are reversed.

The switching from the FRAM mode to the DRAM mode need not be done for all memory cells at once. That is, it is possible to change only the area of interest to the DRAM mode and leave other areas in the FRAM mode. This theoretically poses no problem. The DRAM mode, however, requires the refreshing operation at certain time intervals. If this refreshing operation is carried out for that memory area, other areas may be left in the FRAM mode. Performing such a refreshing operation in a way mentioned above, however, requires additional management of refresh addresses. Furthermore, in memory devices in which the refreshing operation is done by a built-in automatic refreshing circuit, the refreshing is performed for all memory cells. Considering these problems, it is preferred that the switching from the FRAM mode to the DRAM mode be done for all memory cells at once.

FIG. 22 shows a block diagram of one embodiment of a semiconductor memory device using the above-mentioned memory cells and peripheral circuits outside the memory device. The peripheral circuits may also be mounted on the semiconductor chip to have the memory cells and associated circuits incorporated in a single-chip device.

A semiconductor memory device D&FRAM having the above-mentioned DRAM mode and FRAM mode basically includes a memory mat (or memory array) similar to that of the DRAM, a column selection circuit (word line selection circuit), a row selection circuit (bit line selection circuit), and an input/output circuit.

The memory mat is similar in configuration to the memory mat or memory array of known dynamic RAMs, except that each memory cell has a pair of capacitors, of which at least one is a ferroelectric capacitor. It is understood that the memory mat also includes a sense amplifier, a bit line precharge circuit, and a column switch circuit.

The row selection circuit comprises an address buffer for receiving a row address, an address decoder, and a word line drive circuit. The column selection circuit comprises an address buffer for receiving a column address, an address decoder, and a selection output circuit. The input/output circuit includes an input buffer, a write amplifier, a main amplifier, and an output buffer.

In FIG. 22 the row and column selection circuits are shown to be supplied respective addresses. In an address multiplex type in which the row addresses and the column addresses are sequentially entered by the address strobe signals RAS and CAS, these address signals are sequentially input from a common address terminal.

A voltage application monitor circuit monitors supply voltages VCC and VSS to be supplied to the semiconductor memory device D&FRAM and, when it detects the interruption of the supply voltages, sends a detection output to a mode setting circuit.

When the mode setting circuit detects such a cutoff of the supply voltages, it sends a control signal to the row selection circuit to deselect all word lines. When the memory circuit is in operation, the word lines are deselected after the rewriting of the memory cells has been completed. When the memory circuit is in the nonselected state, the mode setting circuit leaves it unselected and prohibits the refreshing operation. In addition to the deselection operation on the word lines for the row selection circuit, the mode setting circuit controls the plate voltage generation circuit to reverse the plate voltages temporarily.

When the applied voltage monitor circuit, the mode setting circuit and the plate voltage generation circuit are incorporated into the semiconductor chip on which the D&FRAM is formed, the mode setting circuit may be included in the control circuit. That is, according to the control signals such as RAS, CAS and WE, the control circuit produces control signals necessary for effecting the read mode, write mode and refresh mode in the DRAM mode, and for switching from the DRAM mode to the FRAM mode and vice versa.

Figure 23:
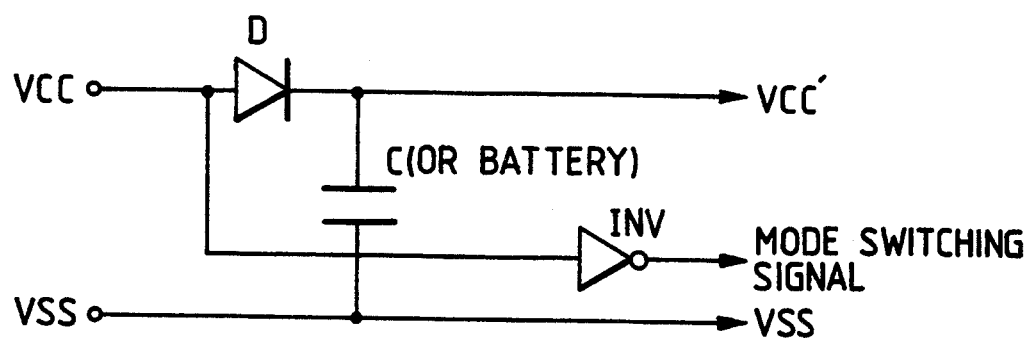
FIG. 23 is a circuit diagram showing one example of a power supply circuit provided to the semiconductor memory device of this invention.

FIG. 23 shows one embodiment of a power supply circuit provided in the semiconductor memory device according to this invention. In this embodiment, a capacitor C is built into the semiconductor chip or a package in which it is contained, and the voltage held in this capacitor is used for effecting the switch from the DRAM mode to the FRAM mode. In the semiconductor memory device of this embodiment, the switching only requires deselecting all word lines and temporarily switching the plate voltages, and thus can be done by using the voltage retained in the capacitor C.

In this case, the inverter circuit INV may be utilized as the applied voltage monitor circuit. The inverter circuit INV is driven by the voltage retained in the capacitor C and at the same time detects a fall in the supply voltage VCC to produce a mode switching signal, which causes the switching from the DRAM mode to the FRAM mode. A diode D is to prevent the capacitor C from being discharged backward to the supply voltage terminal VCC side.

The capacitor C may be replaced with a battery. In that case, since the battery cannot be built into the semiconductor chip, the diode and battery may be provided to a card that mounts semiconductor chips or to an equipped substrate making up a memory device.

Figure 24:
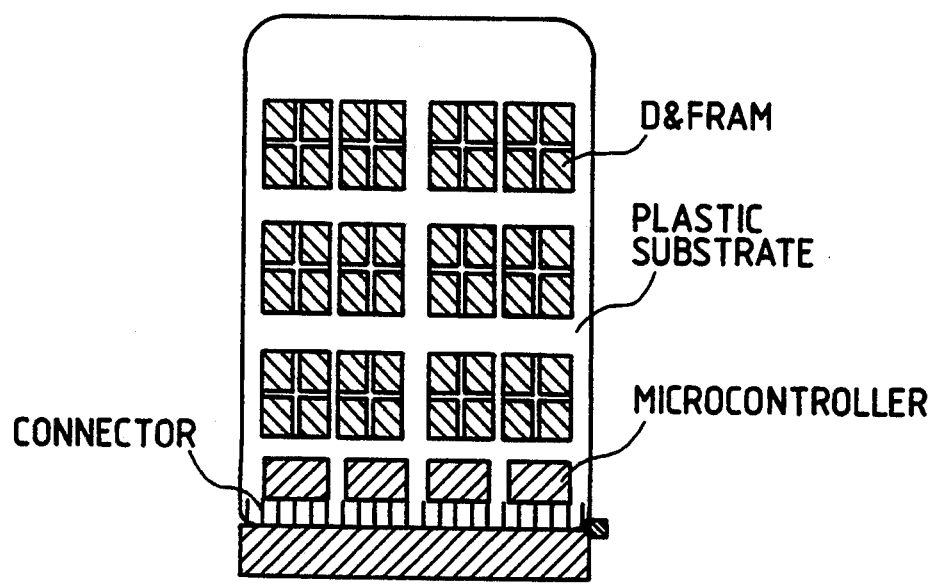
FIG. 24 is an outline view showing the essential portion of an IC card using the DRAMs and FRAMs (D&FRAM) of this invention.

FIG. 24 shows an outline view of an IC card using the D7FRAM of this invention. The D&FRAM of this invention and a microcontroller are mounted on a plastic substrate. The microcontroller is a control circuit for the D&FRAM of this invention and controls its operation. The internal wiring of the D&FRAM and microcontroller is interconnected with the wiring on the plastic substrate. The connectors of the IC card are electrically connected to the wiring on the plastic substrate and connects to an interface circuit of an external system. In this way, the IC card can be used for storing information on various systems.

While the above embodiment has shown the microcontroller as the D&FRAM control circuit to be incorporated in the IC card, the microcontroller may be provided independently. If the IC card is used as an exchangeable auxiliary storage medium in small or portable computer systems up to workstations, the feature of this medium of not being required to be rotated, as the conventional floppy disks are, will contribute not only to reductions in the size, weight and thickness of the system and in power consumption but also to fast read/write operations on large volumes of information as with DRAMs, which in turn improves the processing capability of the system as a whole.

Figure 25:
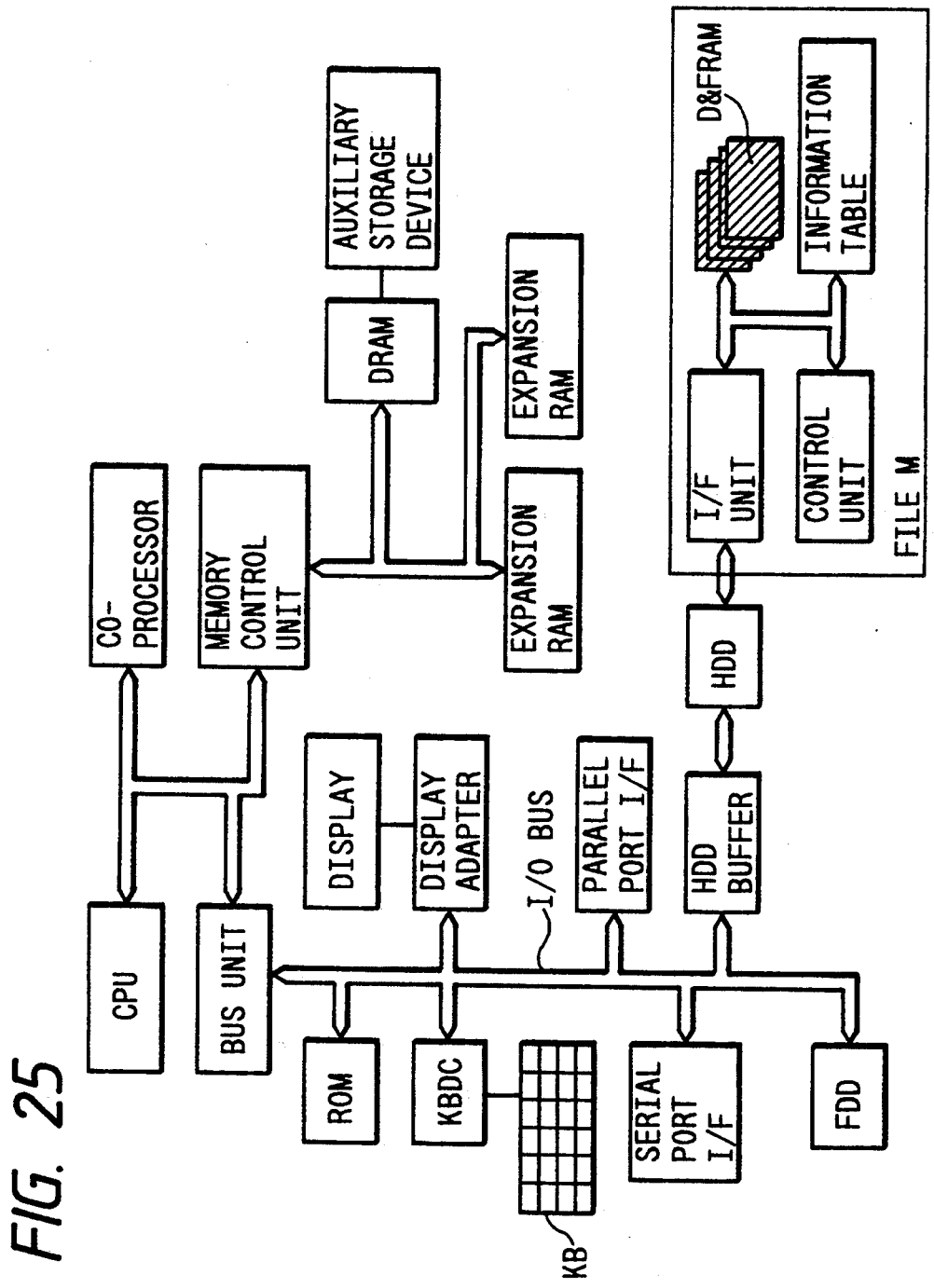
FIG. 25 is a schematic diagram showing the essential portion of a computer system using the D&FRAM of this invention.

FIG. 25 shows the outline configuration of a computer system using the D&FRAM of this invention. This computer system consists of: a central processing unit CPU; an I/O bus running in the information processing system; a bus unit, a memory control unit that accesses high-speed memory such as main memory and extension memory; a DRAM as a main memory, a ROM storing a basic control program, and a keyboard controller KBDC connected with a keyboard.

A display adapter is connected at one end to the I/O bus and at the other end connected with a display. The I/O bus is connected with a parallel port I/F, a serial port I/F such as a mouse, a floppy disk drive FDD, and a buffer controller HDD buffer that converts I/O bus signals into HDDI/F signals. The memory control unit is connected through a bus with extension RAMs and a DRAM as the main memory.

Now, the operation of the computer system will be explained. When power is turned on and the computer starts, the central processing unit CPU accesses the ROM through the I/O bus to make initial diagnosis and initial setting. It then loads the system program from the auxiliary storage device into the DRAM as the main memory. The central processing unit CPU also accesses the HDD controller HDD through the I/O bus. When the system program loading is completed, the central processing unit CPU executes processing according to demands from the user.

The user enters necessary inputs through the keyboard controller KBDC and the display adapter on the I/O bus. The user also uses input/output devices connected to the parallel port I/F and serial port I/F.

When the capacity of the DRAM as the main memory is not sufficient, the extension RAMs may be used for additional capacity. When the user wishes to read from or write into a file, he or she makes a request for accessing the hard disk drive HDD as the auxiliary device. In response to the access request, a file memory system comprising the D&FRAM of this invention accesses file data.

Figure 26:
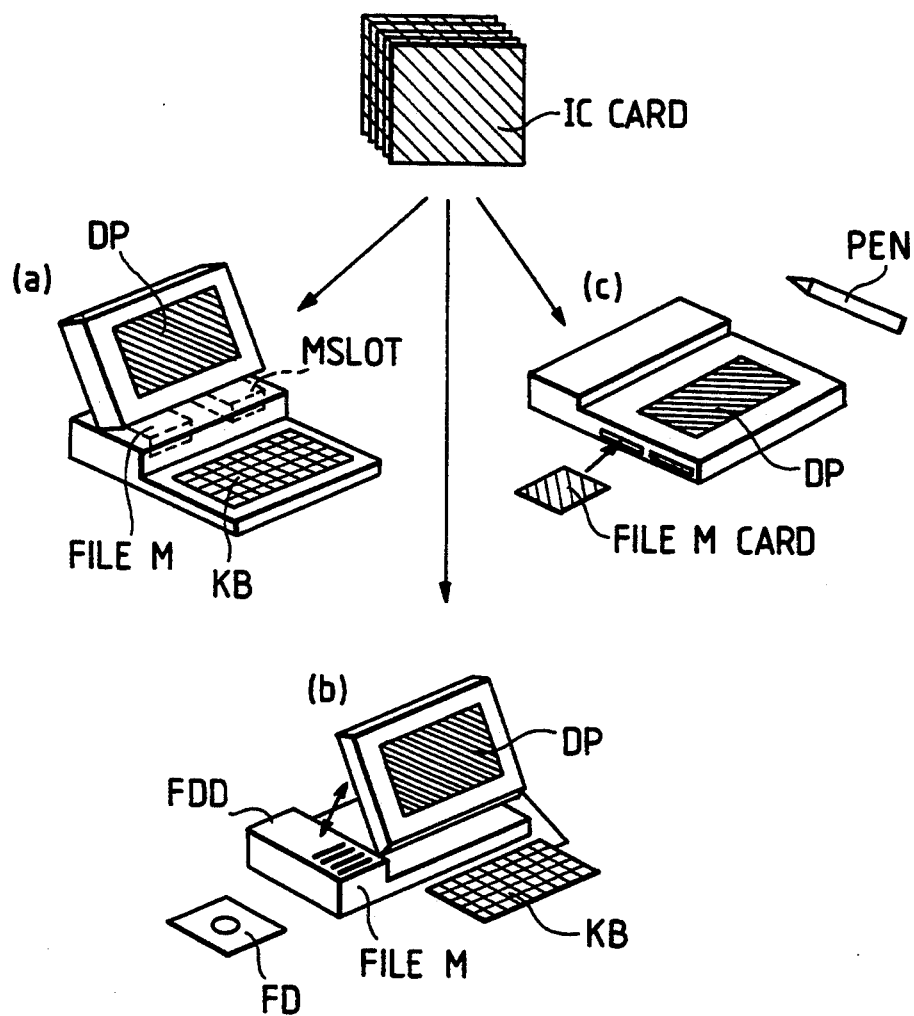
FIG. 26 is an outline view showing example applications of the computer system using the D&FRAM of this invention.

FIG. 26 shows an example application of the computer system. FIG. 26(a) illustrates a system that has an IC card slot MSLOT and incorporates a file memory fileM made of an IC card with the D&FRAM of this invention. This is a note type personal computer with a keyboard KB and a display DP as input/output devices.

FIG. 26(b) shows a system incorporating a floppy disk drive FDD and a file memory fileM. The file memory is formed by an IC card incorporating the D&FRAM of this invention. The system has a keyboard KB and a display DP as input/output devices. A floppy disk FD is inserted into the floppy disk drive FDD. This configuration results in a desktop type personal computer that can accept the floppy disk FD as software and store information in the file memory fileM as hardware.

FIG. 26(c) illustrates a pen portable type personal computer that accepts a file memory card fileMCARD, an IC card incorporating the D&FRAM of this invention, and has an input pen PEN and a display DP as input/output devices. In this way, the D&FRAM of this invention has a wide range of application for the computer systems.

The application of the D&FRAM eliminates the need to rotate the conventional disks, which will contribute not only to reductions in the size, weight and thickness of the system and in power consumption, but also to fast read/write operations on large volumes of information. This in turn improves the processing capability of the system as a whole. Since the conventional disks are replaced with the D&FRAM of this invention, the impact resistance, an important consideration of portable computers, can be improved enhancing the reliability of the computer systems.

Figure 27:
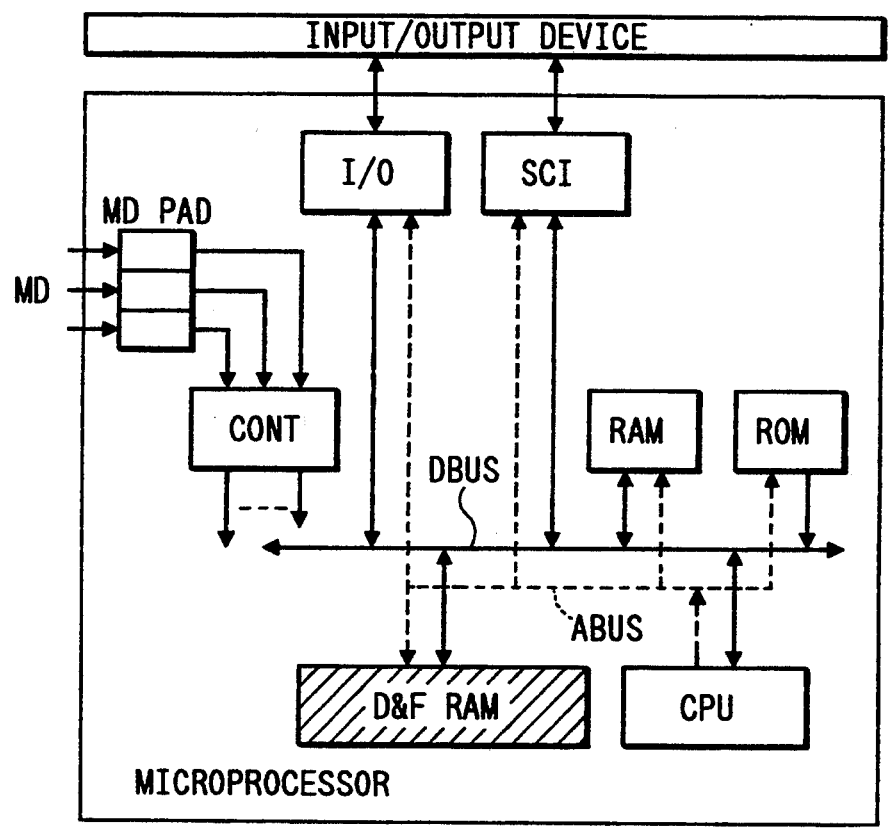
FIG. 27 is a block diagram showing the essential portion of a microprocessor system incorporating the D&FRAM of this invention.

FIG. 27 shows a rough configuration of a microprocessor system with a built-in D&FRAM of this invention. The microprocessor MPU comprises: a central processing unit cPu; a D&FRAM of this invention; a serial communication interface SCI; a read-only memory ROM; a random access memory RAM; peripheral circuits such as input/output circuits; and a control circuit CONT. In this microprocessor MPU the rewrite control program to be executed by the central processing unit CPU is written into the D&FRAM of this invention beforehand by a program store in the DRAM mode.

The mode signal MD supplied to the mode signal input terminal MDPAD controls data transfer, through the data bus DBUS, among the central processing unit CPU, the input/output circuit I/O, the serial communication interface SCI, the read-only memory ROM, the random access memory RAM, and the D&FRAM. The central processing unit CPU controls the operation of the D&FRAM of this invention. The input/output circuit I/O and the serial communication interface SCI both interface with the input/output device for data transfer.

The D&FRAM of this invention perform addressing, through address buses, among the input/output circuit I/O, the serial communication interface SCI, the random access memory RAM, and the read-only memory ROM. Unrewritable basic system program is stored in the read-only memory ROM.

The D&FRAM of this invention in the microprocessor system including the input/output devices permits the stored information to be written over according to the directions from the central processing unit CPU. In the DRAM mode the stored information in the D&FRAM can be written over as in the DRAM. Applying the D&FRAM of this invention to the microprocessor system helps reduce the power consumption. The D&FRAM also permits fast reading and writing of large volumes of information, reduction in the size of the microprocessor and an improved processing capability of the microprocessor system as a whole.

Figure 28:
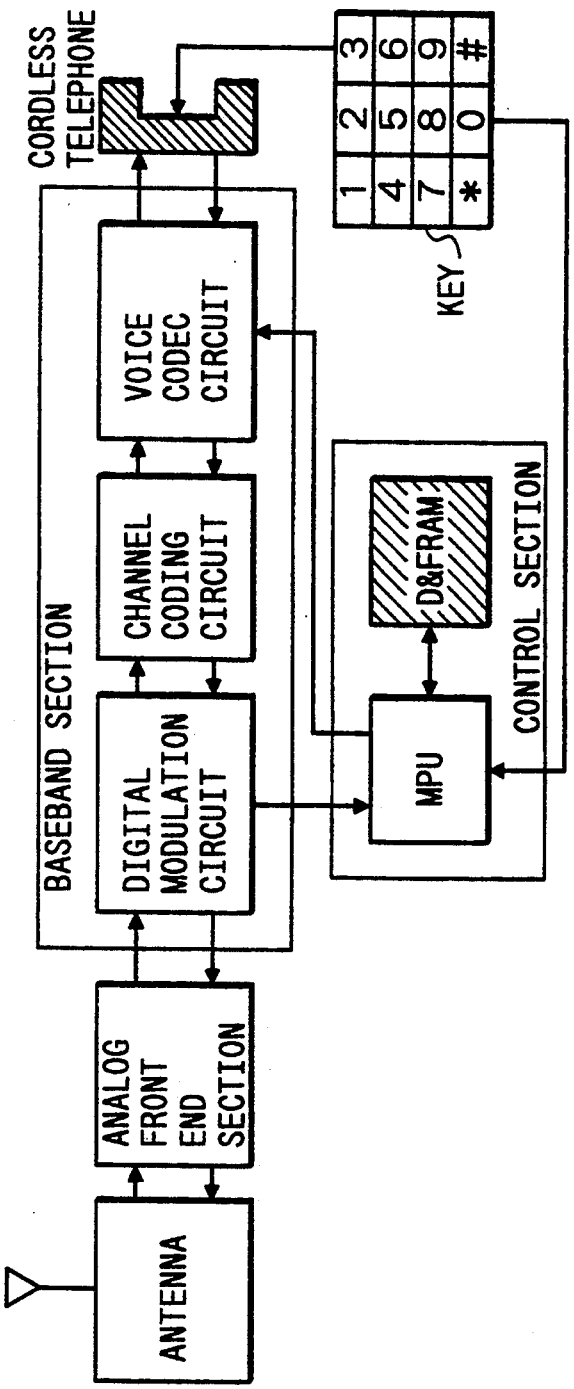
FIG. 28 is a block diagram showing the essential portion of a cordless telephone system incorporating the D&FRAM of this invention.

FIG. 28 shows the outline configuration of a cordless telephone system incorporating the D&FRAM of this invention. The reception of voice by a cordless telephone set with a built-in D&FRAM of this invention is explained below. Radio waves received by an antenna are entered through an analog front end into a digital modulation circuit in the baseband section where they are equalized and subjected to the analog-digital conversion. The output signal of the digital modulation circuit is fed to a channel coding circuit which corrects errors and breaks down a frame of the signal. The output signal of the channel coding circuit is sent to a voice codec circuit where it is subjected to the digital-analog conversion and voice elongation, before being sent to the speaker of the cordless telephone set.

The sending of voice or sound by a cordless telephone set incorporating the D&FRAM of this invention will be described. Voice entered into the microphone of the cordless telephone is sent to the voice codec circuit in the baseband section where it is subjected to the analog-digital conversion and voice contraction. It is then fed to the channel coding circuit, which corrects errors and performs frame assembly of the voice signal. Then the voice signal is fed to the digital modulation circuit where it is subjected to waveform equalization and digital-analog conversion, before being sent out through the analog front end to the antenna.

In the control section made up of the microprocessor and the D&FRAM of this invention, the microprocessor is connected bidirectionally to the D&FRAM. Manipulating keys on the cordless telephone set enters a signal to the microprocessor, which in turn writes shortened dial numbers and codes into the D&FRAM of this invention. The shortened dial numbers and codes stored in the D&FRAM can also be read out by key manipulation.

The digital modulation circuit and voice codec circuit are controlled by the microprocessor. Application of the D&FRAM of this invention to the control section of the cordless telephone set reduces not only the size of the control section but the size, weight and power consumption of the cordless telephone. The D&FRAM also permits fast reading and writing of large volumes of information. These features in turn result in an improved overall processing capability of the system. Another feature of the D&FRAM is that the shock resistance of the portable telephone, an important aspect requiring consideration, can be improved contributing to enhanced reliability of the cordless telephone system.

Figure 29:
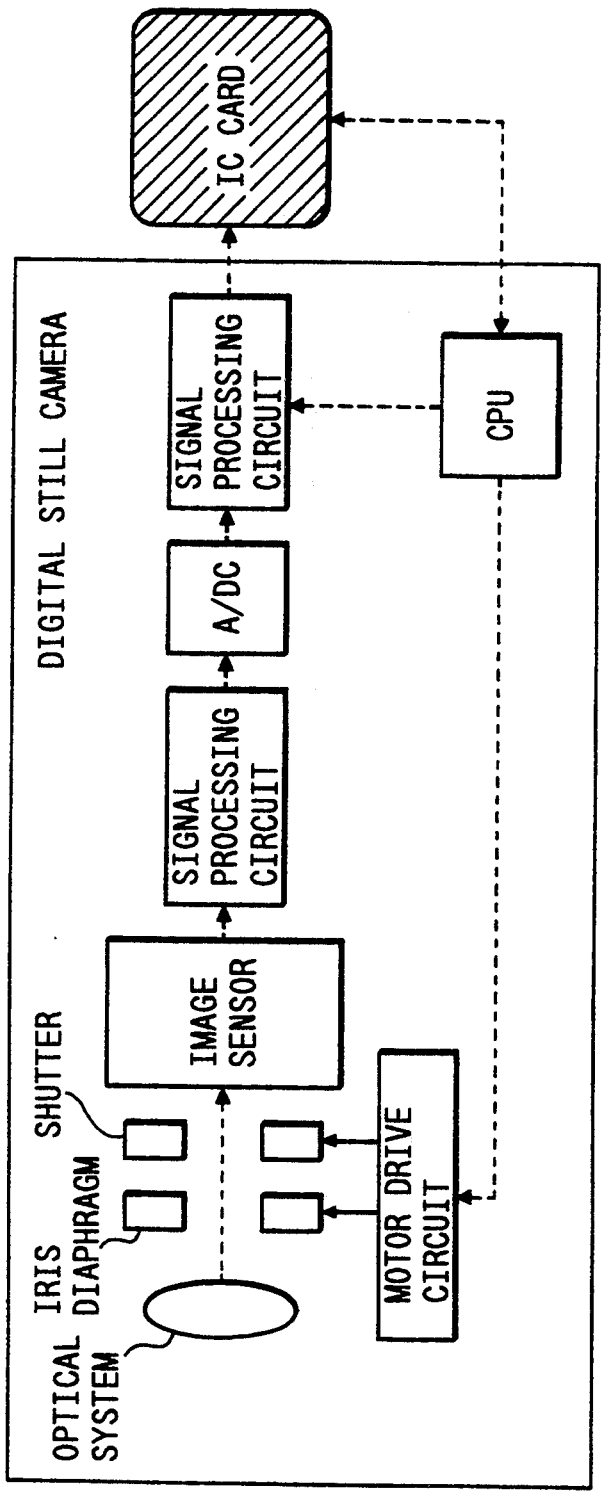
FIG. 29 is a block diagram showing the essential portion of a digital still camera system incorporating an IC card with the built-in D&FRAM of this invention.

FIG. 29 shows the outline configuration of a digital still camera system using an IC card incorporating the D&FRAM of this invention. The digital still camera system consists of an optical system, a central processing unit CPU, a motor drive circuit, an iris diaphragm, a shutter, an image sensor, a signal processing circuit, and an analog-digital conversion circuit A/DC.

An object is imaged on the optical system, and the diaphragm and shutter are controlled by the motor drive circuit which in turn is controlled by the central processing unit CPU. The image of an object is focused, through the diaphragm and shutter, on the image sensor. The image formed on the image sensor is transformed into signals by the signal processing circuit. The signal is then entered into the analog-digital conversion circuit A/DC, which produces a digital signal.

The digital signal of the image is further fed to the signal processing circuit controlled by the central processing unit CPU where the image data is contracted, before being stored in the D&FRAM-incorporated IC card. In this way, applying the IC card incorporating the D&FRAM of this invention to the digital still camera system reduces the size, weight and thickness and power consumption of the camera. The D&FRAM also permits fast reading and writing of large volumes of information. These features combine to improve an overall processing capability of the system. The D&FRAM can also improve the shock resistance of the camera, an important aspect requiring consideration, thus contributing to enhanced reliability of the digital still camera system.

Figure 30:
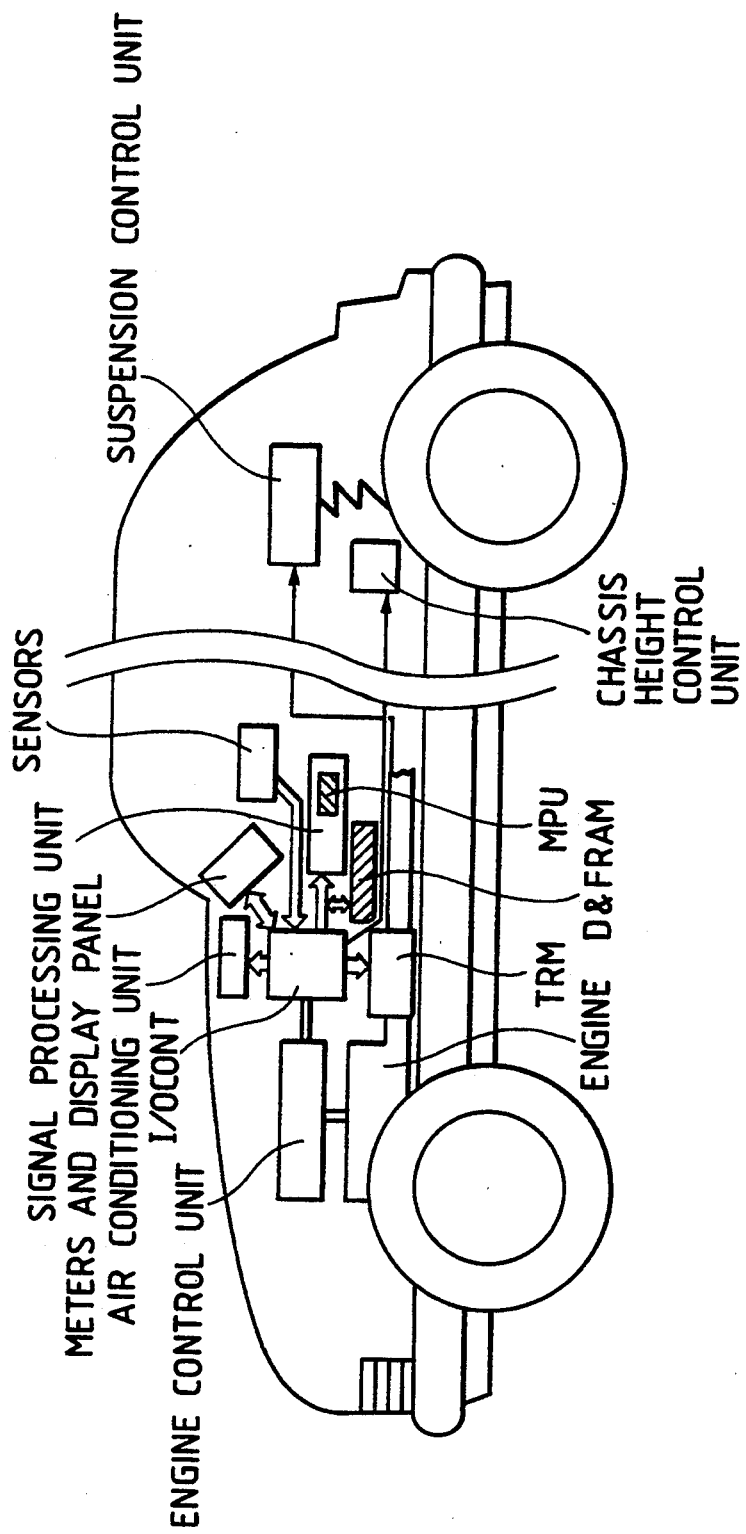
FIG. 30 is a schematic view of an automotive system incorporating the D&FRAM of this invention and a microprocessor with the built-in D&FRAM.

FIG. 30 shows an outline configuration of an automotive system using the D&FRAM of this invention as memory cells. The input/output control unit I/O-CONT controls an air-conditioning unit, sensors and a transmission TRM that transmits engine power to driving wheels, and performs signal transfers to and from meters and a display panel. The engine is controlled by the engine control unit. The input/output control unit I/OCONT controls the D&FRAM of this invention as a memory unit, via a signal processing unit which contains a microprocessor MPU incorporating the D&FRAM of this invention, to read and write information to and from the D&FRAM memory.

The output signal from the transmission TRM is fed to a chassis height control unit and a suspension control unit to control the motion of the car body. While in this embodiment the D&FRAM of this invention is incorporated into the microprocessor and the memory unit, it can also be applied to any desired units. The use of the D&FRAM reduces the size, weight and electric power consumption of the automotive system, which in turn leads to improved fuel consumption. The D&FRAM also improves the shock resistance, thus enhancing the reliability of the system. Because of its large memory capacity, the D&FRAM provides the control system with a higher processing capability with a fewer number of parts.

Advantages of the above embodiments are summarized below.

(1) A ferroelectric capacitor and another ferroelectric capacitor or dielectric capacitor have one of their electrodes commonly connected to an address selection switching element with its gate connected to a word line and the other of their electrodes connected to first and second plate voltage supply line, respectively. Two operation modes are provided. A first operation mode has a first voltage supplied to a first plate voltage supply line and a second voltage to a second plate voltage supply line. A second operation mode has the second voltage supplied to the first plate voltage supply line and the first voltage to the second plate voltage supply line. In the first operation mode, the ferroelectric capacitors are supplied with a voltage of one direction or 0 V according to the write information from the data line, so that the polarization of the capacitors is not reversed and no degradation of the ferroelectric films occurs. In the second operation mode, however, the polarization is reversed according to the information stored in each memory cell, permitting an instantaneous writing of FRAM.

(2) Because the polarization of the ferroelectric film is reversed only before and after the power is turned on as described in (1) above, the limit on the number of writing operations can virtually be eliminated.

(3) The memory cells can increase their circuit density and can be manufactured easily by employing a stacked structure in which the ferroelectric capacitor is laid over the dielectric capacitor used for a dynamic memory cell.

(4) In a semiconductor memory device as a storage unit using the DRAM mode and FRAM mode mentioned above, the second operation mode is executed to the memory cells in the event of power supply interruption, by switching the power source to a capacitor or battery and detecting the power interruption by a supply voltage monitor circuit. This renders the stored data nonvolatile instantaneously.

(5) Because of (4), it is possible to provide an information processing system having a memory device with flexibility.

(6) The power supply device dedicated for making the stored information nonvolatile can be simplified by mounting the capacitor or battery used to execute the second operation mode on the semiconductor memory device itself or on a storage unit.

The invention has been described in conjunction with the above embodiment. It is noted, however, that the invention is not limited to the above embodiment alone and that various modifications may be made without departing from the spirit of this invention. When one of the capacitors is a dielectric capacitor as in the above embodiment, the operation is similar to the above explanation except that when the voltage difference between the two electrodes is 0 V, the polarization changes almost linearly to 0 in response to the voltage difference, unlike the ferroelectric capacitor that, in the same condition, will have a residual polarization. When, in the DRAM mode, with the plate voltage VPL1 set to 0 V and VPL2 to 5 V, the mode is switched to the FRAM mode or from the FRAM mode to the DRAM mode, the plate voltages may be reversed temporarily.

The memory mat may be divided into two parts, one consisting of the above-mentioned two-capacitor memory cells and one consisting only of DRAM memory cells. In this configuration, the memory mat of the DRAM memory cells may be used as a memory area to store only data that does not require the operation for making the memory cells nonvolatile. The memory mat of the two-capacitor memory cells may be used as a memory area requiring the nonvolatilization operation.

This invention has a wide range of application for semiconductor memory devices having DRAM and FRAM modes and for information processing systems using such memory devices.

Representative advantages offered by this invention may be briefly summarized as follows. That is, a ferroelectric capacitor and another ferroelectric capacitor or dielectric capacitor have one of their electrodes commonly connected to an address selection switching element with its gate connected to a word line and the other of their electrodes connected to first and second plate voltage supply line, respectively. Two operation modes are provided. A first operation mode has a first voltage supplied to a first plate voltage supply line and a second voltage to a second plate voltage supply line. A second operation mode has the second voltage supplied to the first plate voltage supply line and the first voltage to the second plate voltage supply line. In the first operation mode, the ferroelectric capacitors are supplied with a voltage of one direction or 0 V according to the write information from the data line, so that the polarization of the capacitors is not reversed and no degradation of the ferroelectric films occurs. In the second operation mode, however, the polarization is reversed according to the information stored in each memory cell, permitting an instantaneous writing of FRAM.

We claim:

1. A semiconductor memory device comprising: a switching element for address selection which has its gate connected to a word line;
a ferroelectric capacitor which has one of electrodes thereof connected to a data line through the switching element and the other of the electrodes connected to a first plate voltage supply line; and
a capacitor which has one of electrodes thereof commonly connected to the first electrode of the ferroelectric capacitor and the other of the electrodes connected to a second plate voltage supply line;
wherein a first operation mode and a second operation mode are provided, the first operation mode has a first voltage supplied to the first plate voltage supply line and a second voltage supplied to the second plate voltage supply line, and the second operation mode has the second voltage supplied to the first plate voltage supply line and the first voltage supplied to the second plate voltage supply line.

2. A semiconductor memory device according to claim 1, wherein the first voltage is a ground potential of a circuit and the second voltage is a power supply voltage.

3. A semiconductor memory device according to claim 2, wherein the first operation mode is performed to make an ordinary access to memory and the second operation mode is performed before the power supply is interrupted.

4. A semiconductor memory device according to claim 1, wherein the capacitor connected to the second plate voltage supply line is a ferroelectric capacitor.

5. A semiconductor memory device according to claim 1, wherein the capacitor is a dielectric capacitor used in a dynamic memory cell and the ferroelectric capacitor is stacked on the dielectric capacitor.

6. A semiconductor memory device according to claim 1, wherein the ferroelectric capacitor and the capacitor are each formed in a fin construction and stacked one upon the other.

7. A semiconductor memory device according to claim 1, wherein one of the ferroelectric capacitor and the capacitor is formed in a fin construction and the other is formed in a trench construction.

8. An information processing system comprising:
a semiconductor memory device; and
a power supply voltage monitor circuit; wherein the semiconductor memory device comprising:
a switching element for address selection which has its gate connected to a word line;
a ferroelectric capacitor which has one of electrodes thereof connected to a data line through the switching element and the other of the electrodes connected to a first plate voltage supply line; and
a capacitor which has one of electrodes thereof commonly connected to the first electrode of the ferroelectric capacitor and the other of the electrodes connected to a second plate voltage supply line;
wherein a first operation mode and a second operation mode are provided, the first operation mode has a first voltage supplied to the first plate voltage supply line and a second voltage supplied to the second plate voltage supply line, the first voltage corresponding to a power supply voltage, the second voltage corresponding to a ground potential of a circuit, and the second operation mode has the second voltage supplied to the first plate voltage supply line and the first voltage supplied to the second plate voltage supply line; and
wherein the power supply voltage monitor circuit detects an interruption of the power supply voltage to the semiconductor memory device and causes the semiconductor memory device to execute the second operation mode.

9. An information processing system according to claim 8, wherein the power supply voltage monitor circuit detects an interruption of the power supply voltage and feeds a standby power supply voltage to the semiconductor memory device.

10. An information processing system according to claim 9, wherein the semiconductor memory device is constructed in the form of a card.

* * * * *